(12) United States Patent
Jang (10) Patent No.: US 9,188,367 B2
(45) Date of Patent: Nov. 17, 2015

(54) SOLAR POWER GENERATION APPARATUS CAPABLE OF TRACKING SUNLIGHT

(75) Inventor: Yun-Kyu Jang, Suncheon-si (KR)

(73) Assignee: SunEdison, Inc., St. Peters, MO (US)

( * ) Notice: Subject to any disclaimer, the term of this patent is extended or adjusted under 35 U.S.C. 154(b) by 916 days.

(21) Appl. No.: 13/319,290

(22) PCT Filed: Jun. 18, 2009

(86) PCT No.: PCT/KR2009/003283
§ 371 (c)(1),
(2), (4) Date: May 11, 2012

(87) PCT Pub. No.: WO2010/128708
PCT Pub. Date: Nov. 11, 2010

(65) Prior Publication Data
US 2012/0216851 A1    Aug. 30, 2012

(30) Foreign Application Priority Data

May 7, 2009  (KR) .................. 10-2009-0039896

(51) Int. Cl.
| | | |
|---|---|---|
| *H01L 31/042* | (2014.01) | |
| *F24J 2/54* | (2006.01) | |
| *H01L 31/04* | (2014.01) | |
| *F24J 2/52* | (2006.01) | |

(52) U.S. Cl.
CPC .............. *F24J 2/541* (2013.01); *F24J 2/5264* (2013.01); *H01L 31/04* (2013.01); *F24J 2002/5468* (2013.01); *F24J 2002/5493* (2013.01); *Y02E 10/47* (2013.01)

(58) Field of Classification Search
CPC ............... H01L 31/00–31/208; Y02E 10/47; Y02E 10/50–10/60
USPC ................................... 136/243–265
See application file for complete search history.

(56) References Cited

U.S. PATENT DOCUMENTS

| | | | | |
|---|---|---|---|---|
| 4,421,943 | A | * 12/1983 | Withjack | 136/246 |
| 2006/0044511 | A1 | * 3/2006 | Mackamul | 353/3 |

(Continued)

FOREIGN PATENT DOCUMENTS

| | | |
|---|---|---|
| KR | 20050110010 A | 11/2005 |
| KR | 20080058360 A | 6/2008 |
| KR | 100872069 B1 | 12/2008 |
| KR | 100886376 B1 | 3/2009 |

OTHER PUBLICATIONS

PCT International Search Report mailed on May 13, 2010 regarding PCT/KR2009/003283; 4 pages.

*Primary Examiner* — Bach Dinh
(74) *Attorney, Agent, or Firm* — Armstrong Teasdale LLP (57) ABSTRACT

The present invention relates to a solar power generation apparatus, which comprises: torque tubes which are arranged to form a plurality of columns; a plurality of solar panels which are installed along each torque tube; posts which rotatably support each torque tube; lever arms which are coupled with each torque tube; a linkage which is disposed on the lower side of the torque tubes and is connected to each lever arm; an actuator which reciprocates the linkage in the longitudinal direction of the linkage, thereby rotating the torque tubes around an axis based on the longitudinal direction of the torque tubes; and a bed frame which is installed between some of the plurality of posts, wherein the actuator is supported thereon.

20 Claims, 7 Drawing Sheets

(56) References Cited

U.S. PATENT DOCUMENTS

| | | | |
|---|---|---|---|
| 2008/0236567 A1* | 10/2008 | Hayden | 126/569 |
| 2008/0251115 A1 | 10/2008 | Thompson et al. | |
| 2009/0151775 A1* | 6/2009 | Pietrzak | 136/251 |
| 2009/0256046 A1* | 10/2009 | Hausner et al. | 248/398 |

* cited by examiner

Fig. 8

SOLAR POWER GENERATION APPARATUS CAPABLE OF TRACKING SUNLIGHT

FIELD OF INVENTION

The present invention is related to a solar power generation apparatus. More particularly, the present invention is related to a solar power generation apparatus having a tracking device to rotate the angle of the solar panel in relation to the angle of the sun.

BACKGROUND ART

In order to achieve said technical challenges, the present invention is a synthetic resin bearing for a photovoltaic tracking system including the first and second bearing members coupled with each other for forming a bearing assembly, wherein each of the first and second bearing members comprises of a pair of side plate members facing each other; a friction member positioned between the outer peripheral portions of the pair of side plates and having an arc shaped section; and a reinforcement member for connecting the pair of side plates and the friction member, and the first and second bearing members have a coupling protrusion and a concave portion for receiving the coupling protrusion at the coupling surfaces thereof.

Accordingly, the present invention is to provide the bearing with synthetic resin instead of a metal material and maintaining the proper friction coefficient which made it unnecessary for the addition of a lubricant. The said synthetic resin includes polyamide, PTFE or PEEK material. In addition, the interior of said bearing assembly is not fully filled but is composed of plates such as reinforcement members linked with said plates and friction members and partially empty spaces inside. By doing this, it can reduce the overall weight and reduce the usage of material. It can also prevent molding defects such as shrinkage during the molding process.

On the other hand, in terms of a power generation system using solar energy, a large number of solar panels are generally installed on a vast area of flat land and as it is impossible to install more than 2 panels of solar panels to overlap, a vast space of land is required. Because of this, the power transmission structure to deliver a power generated from an actuator to each solar panel is complex and the power loss during the transmission is increased as well.

In addition, if you consider the cost of installation, a large number of solar panels must be installed in the limited land space but since separate space for an actuator is necessary, the usage of the space becomes low.

In addition, said torque tube is a type that extends to one direction, as deformation during the installation and transportation stage can be possible, it is not easy to correctly couple with said post. As the solar power generation apparatus is generally installed outside area which is not flat, it is very difficult to install each component as it is designed.

DETAILED DESCRIPTION OF THE INVENTION

Technical Challenges

The present invention is devised to overcome the above mentioned traditional disadvantages, and to provide a solar power generation apparatus which uses a single actuator to rotate multiple solar panels effectively.

In addition, the present invention is devised to provide a solar power generation apparatus which does not require separate space for an actuator.

In addition, the present invention is devised to provide a solar power generation apparatus which effectively absorbs the tolerance due to the changes and the non-uniform soils.

Technical Solution

In order to achieve said technical challenges, the present invention provides a solar power generation apparatus, which is comprised of: torque tubes which are arranged to form a plurality of columns; a plurality of solar panels which are installed along each torque tube; posts which support each torque tube to be rotatable; lever arms which are coupled with each torque tube; a linkage which is located on the lower side of the torque tubes and is connected to each lever arm; an actuator which reciprocates the linkage in the longitudinal direction of the linkage, thereby rotating the torque tubes around an axis based on the longitudinal direction of the torque tubes; and a bed frame which is installed between some of the plurality of posts, wherein the actuator is supported thereon.

In other words, in order to rotate the torque tube, a lever arm is connected to a linkage and by enabling said linkage to operate by an actuator; it not only minimizes the number of actuator, but it also simplifies the power transmission requirement. In addition, by supporting the actuator on the bed frame between the posts, the actuator can be positioned under the solar panel on the land, thus space can be effectively utilized.

Here, in order to support two torque tubes, said bed frame can be installed between the posts in the middle of overall posts which will support torque tube and through this, actuator power is transmitted to the middle of said linkage and can minimize the transformation of the linkage.

Here, said bed frame can comprise a pair of beams whose both ends are anchored to a pair of corresponding posts and said actuator can be anchored to a pair of beams.

Said linkage is preferably installed between a pair of said beams and said actuator can include a rod connected to said linkage.

In addition, said post can be comprised of anchor which is anchored to the ground; the first journal half anchored to top of said anchor; the second journal half connected to said first journal half; and bearing which is installed between said first and the second journal half and enable said torque tube to rotate.

Here, said first journal half can have slot type first bolt anchoring holes along the first direction and said first direction can be the length direction of said anchor; by utilizing this, the first journal half's height can be anchored to said anchor and can be adjusted.

Preferably, said anchor can face the said first bolt and can have slot type second bolt anchoring holes along the direction not parallel to the first direction. The second direction can be perpendicular to said first bolt anchoring holes and by utilizing this, the first journal half's anchoring location to said anchor in relation to said linkage's length direction can be adjusted.

In addition, said anchor will have third bolt anchoring holes to anchor to ground and said third bolt anchoring holes have slot type hole in the second direction.

On the other hand, said first journal half is comprised of a semicircle-shaped cross section bearing support member; and a coupling part which is formed as a single piece with said bearing support member and having said second bolt anchoring holes and said coupling part can be located off center of the said bearing support member. By utilizing this, according to the installation direction of the first journal half, it can absorb larger tolerance than the length of the anchoring holes of said first bolt.

On the other hand, said solar panel can be installed on an axis perpendicular to said torque tube's rotational axis, and two axis control system can be utilized also.

Preferably, one side of the said solar panel can be hinge couple to said torque tube, a coupling means can be installed on the other side so that the solar panel can maintain certain angle compared to said torque tube.

Here, said coupling means is installed between the other side of said solar panel and can be comprised of said torque tube, anchoring arm with multiple holes along the length direction; and anchoring pin to connect to said torque tube through one of multiple holes.

Advantageous Effects

According to the invention having said structure, a minimum number of actuators can be used to operate multiple solar panels with simple power transmission structure, so that not only the installation cost can be reduced but the power consumption can be reduced so that the efficiency of power generation can be increased indirectly.

In addition, the actuator can be installed overlapped longitudinally; the installation area can be minimized.

Additionally, by connecting each part using the provided slot type bolt anchoring holes, as the tolerance due to such a non-uniform area can be effectively absorbed, the installation can be easily accomplished.

EMBODIMENT OF THE INVENTION

The solar energy generation apparatus according to the embodiment of the present invention will be described in detail with drawings.

Figure 1:
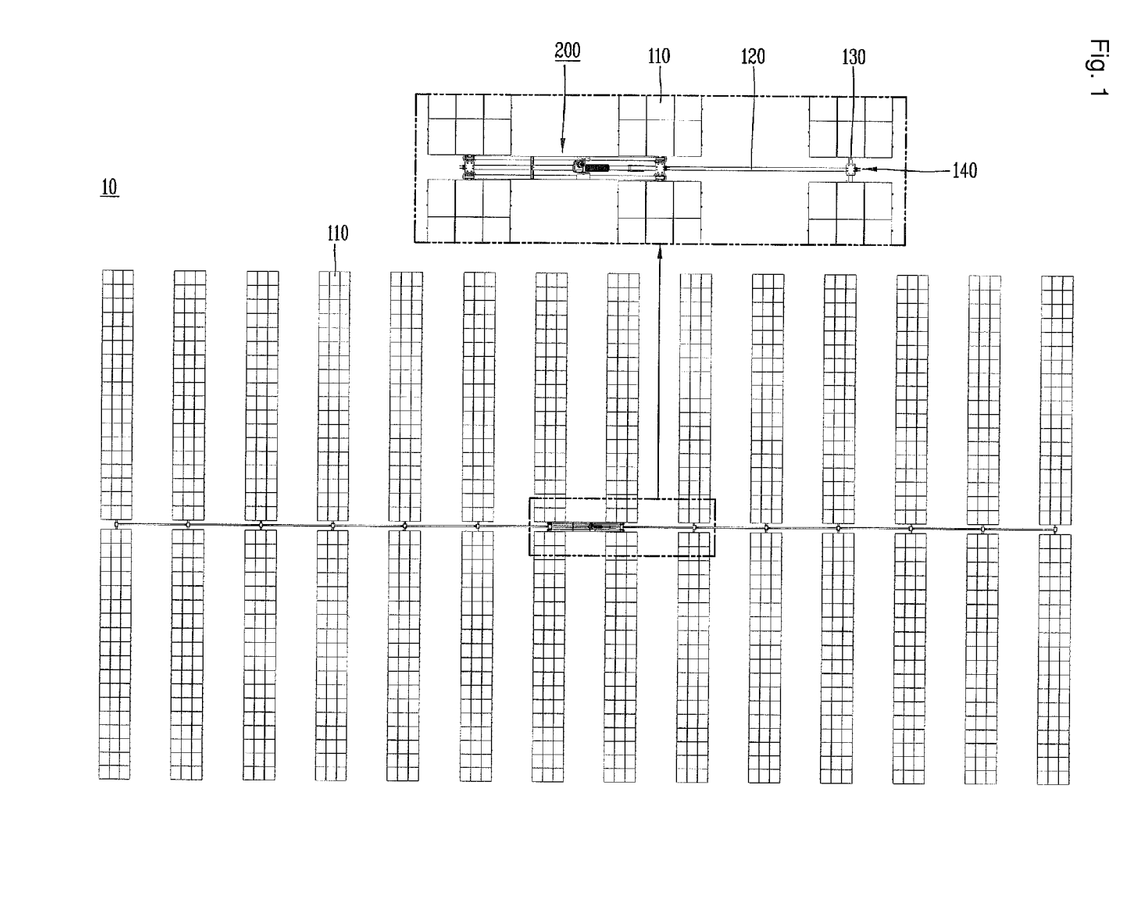
FIG. 1 illustrates a planar view of schematic array of the solar energy generation apparatus according to the present invention.

If you refer to FIG. 1, solar energy generation apparatus (100) according the embodiment of the present invention is illustrated. Said embodiment of (100) is composed of solar panel (110) which is attached to torque tube (130) to form a plurality of rows. FIG. 1 shows 14 rows of solar panels (110) and said torque tubes (130) are under each row.

On the other hand, in the middle rows, more specifically between 7 and 8th row, a drive unit (200) is located. Said drive unit (200) is to generate power and to transmit this power to rotate torque tube (130), which will be described in detail later. In order to transmit the power generated by aid drive unit (200), a linkage (120) is installed along each row of said solar panel (110). Said linkage (120) is extended to run through the middle of solar panel (110) and is connected to each torque tube (130) via said lever arm (140). Said lever arm's (140) purpose is not only to support said linkage (120) but also to convert the linkage's (120) reciprocal movement to said torque tube's (130) rotation movement.

Figure 2:
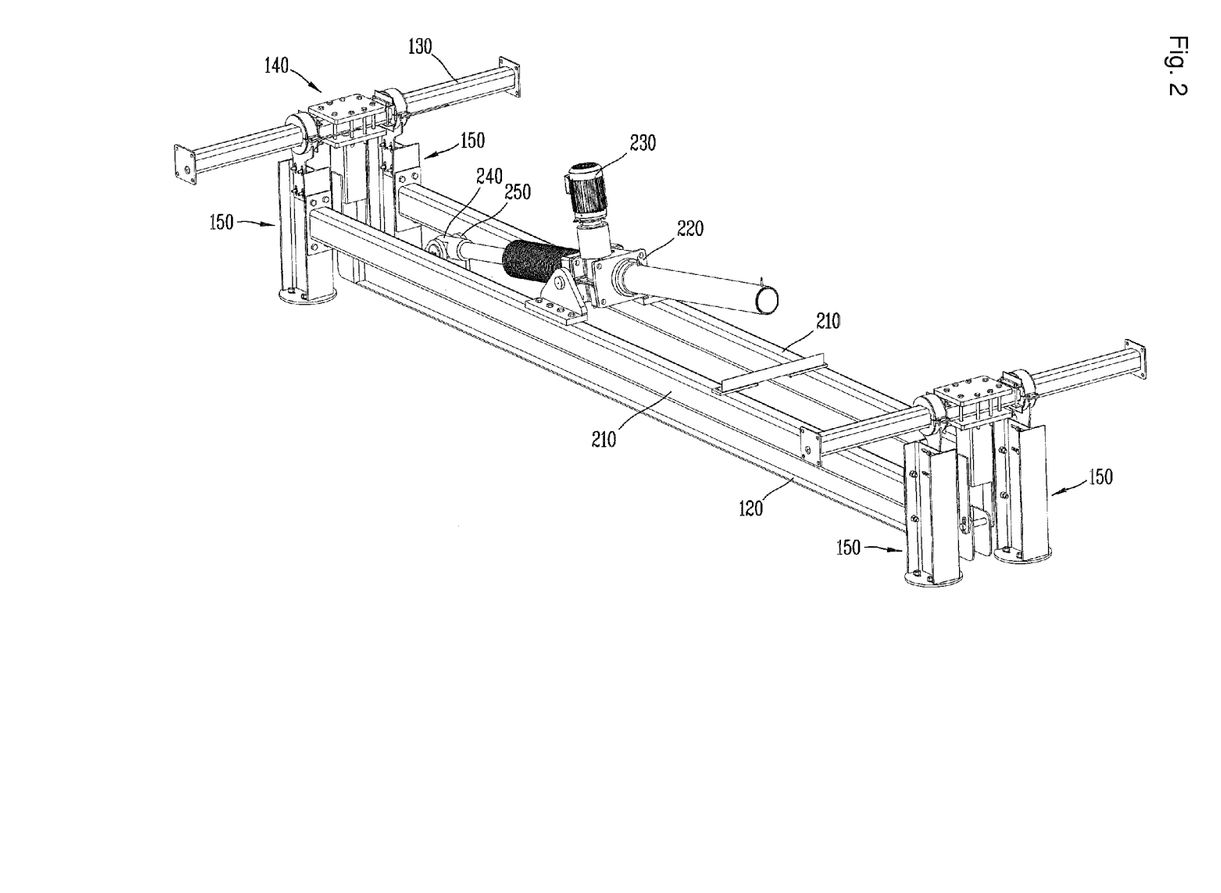
FIG. 2 illustrates the magnified perspective view of the drive unit.

If you refer to FIG. 2, it illustrates said drive unit (200). As it is shown in FIG. 2, said torque tube (130) is supported on top of post (150) to be rotatable and said post (150) is fixed to the ground (160) where solar energy generation apparatus will be installed. On the other hand, said post (150) is installed in plurality to each torque tube (130), and a pair of bed frame (210) is installed between the posts (150) which support torque tube (130) and installed between 7th and 8th row as described.

Said bed frame (210) is a pipe type with rectangular section and an actuator fastening frame (220) is installed on top of bed frame (210) and it can be rotated. On one side of said actuator fastening frame (220), an electric motor (230) is installed to generate power and a screw jack (240) is installed on the other side to connect to said electric motor (230). The end of screw jack (240) is connected to said linkage via hinge connector (250). Consequently, as screw jack (240) moves forward or backward due to electric motor (230), a linkage (120) will be moving forward or backward with gear assembly.

Figure 3:
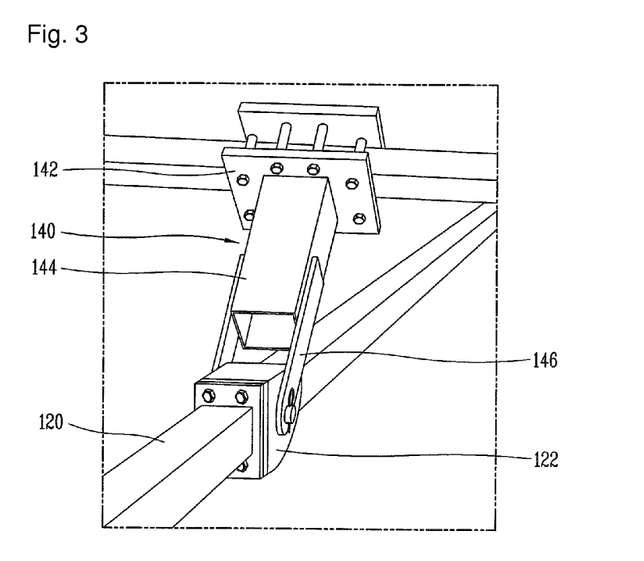
FIG. 3 illustrates the magnified perspective view lever arm portion in FIG. 2.

If you refer to FIG. 3, said lever arm (140) is illustrated. Said lever arm (140) is linking torque tube (130) and linkage (120) and it converts the linkage's (120) reciprocating movement to torque tube's (130) rotational movement. In order to accomplish this, lever arm (140) has pressure plate (142) at one end which presses both side of torque tube (130) and anchors torque tube (130). As the pressure place (142) is firmly anchored to torque tube (130) with multiple anchor bolts and as it can be easily installed along the length of torque tube, it can easily absorb the tolerance which can occur during the manufacturing process.

A linear type arm (144) is connected to said pressure plate (142) and coupling part (146) associated with said linkage (120) is installed at the other end of said arm (144). Said coupling part (146) are extended parallel to both sides of said arm (144) and connected to hinge bracket (122) whose cross section is shaped as "⊏". Here, said linkage (120) is not made of one piece but made of many segments and formed as one linkage and said hinge bracket (122) is anchored between each said segment.

Figure 4:
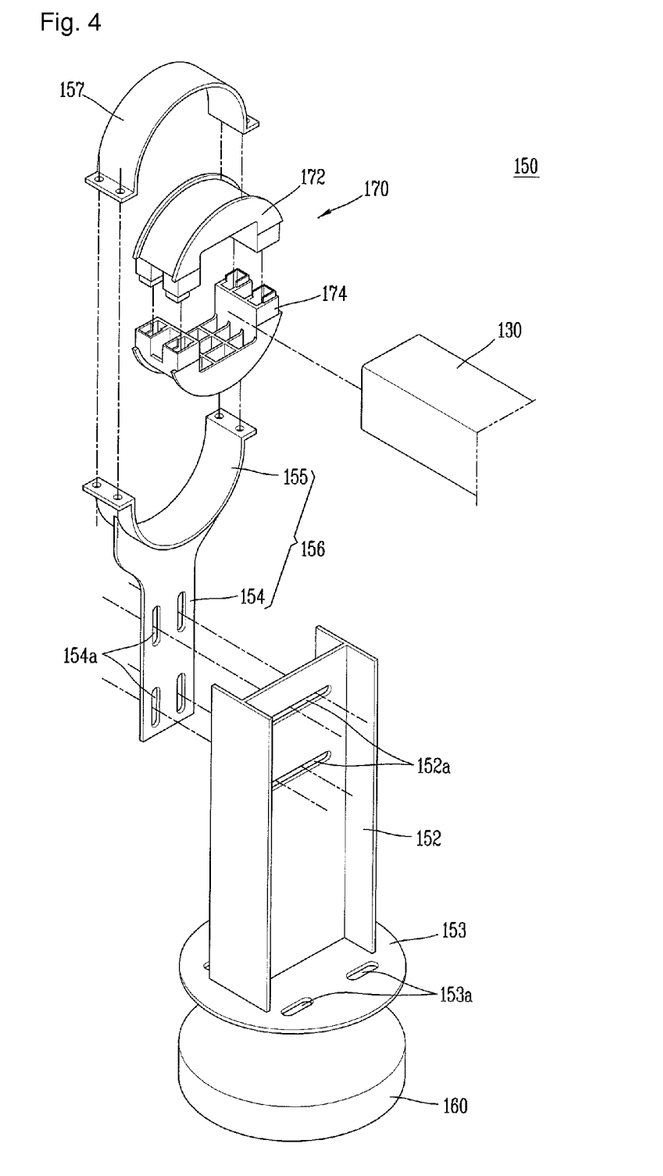
FIG. 4 illustrates the magnified exploded view of post portion in FIG. 2.

If you refer to FIG. 4, said post (150) is illustrated. Said post (150) includes post body (152) which is anchored on top of ground (160) which is pre-installed on the site where solar energy generation apparatus will be installed. A support member (153) is located under said body (152) which contacts with said ground (160). The first bolt anchoring holes (153a) are formed to anchor to said ground (160) with bolt and said first bolt anchoring holes (153a) are slotted holes extended to one direction. Accordingly, it can absorb the installation tolerance according to the length of the first anchoring holes (153a).

In addition, the first journal half (156) is installed on top of said post body (152) and said first journal half (156) is bolted to said post body (152) through the second bolt anchoring holes (154a) and the third anchoring holes (152a) which is formed as slotted holes on top portion of post body (152). Said second and the third bolt anchoring holes are extended to direction perpendicular to each other and using this method, the connecting location of the first journal half (156) to post body (152) can be easily adjusted. Consequently, it can easily absorb tolerances that can occur during the manufacturing process and installation process.

On the other hand, said first journal half (156) includes extender (154) which is connected to said post body (152) and the journal member (155) which is formed on top of the extender (154), the second journal half (157) is connected to the top of said journal member (155). A bearing (170) is inserted between said journal part (155) and the second journal half (157) and said bearing (170) is formed as one bearing by coupling two bearing members (172, 174). Said torque tube (130) is inserted in the center of said bearing (170) and because of this said torque tube (130) is anchored to top of said post (150) and can be rotated.

Figure 5:
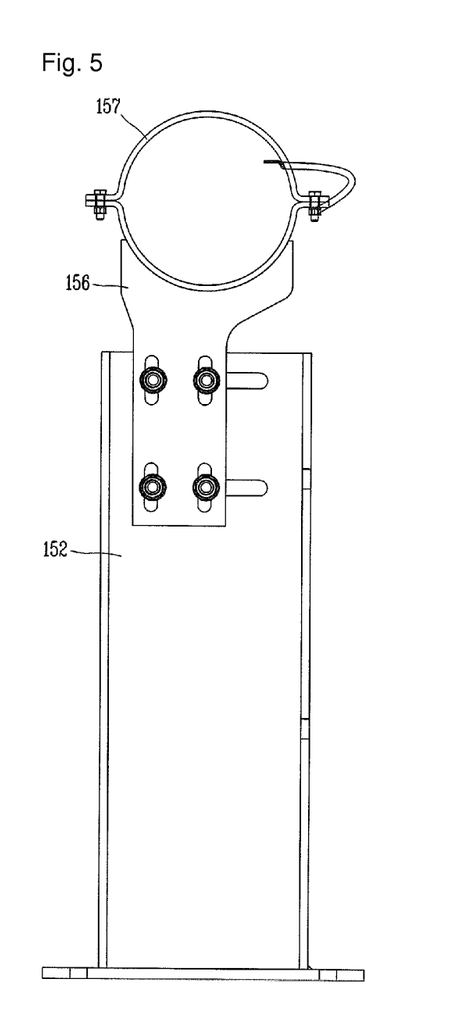
FIG. 5 and FIG. 6 illustrate the frontal view of the connection portion of the first journal half to said post.
Figure 6:
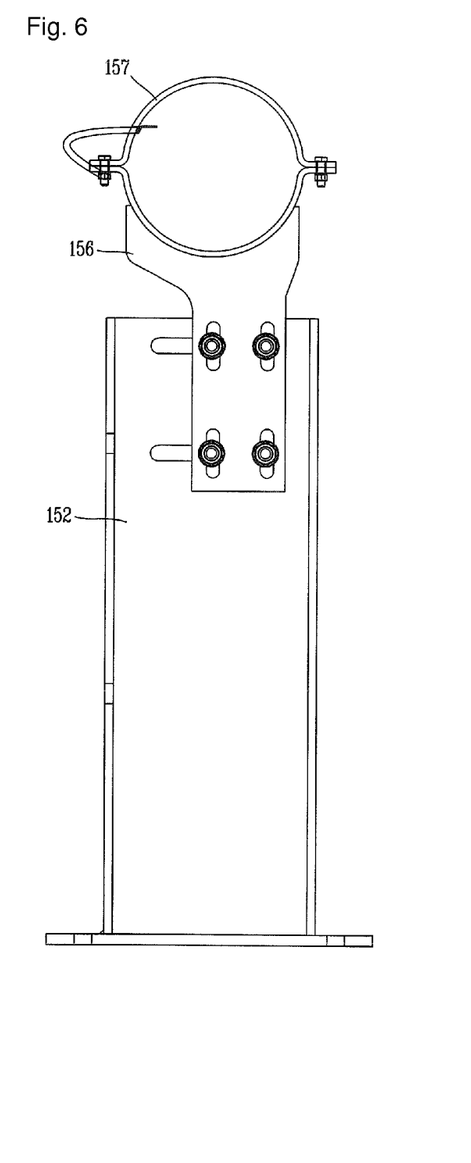

On the other hand, as it is shown in FIG. 5, said first journal half (156) has said extender (154) which is located off center from the center of said journal part (155) Accordingly, as it is shown in FIG. 6, said first journal half (156) can be installed 180° opposite to center to the length direction of post. By doing this, it can maintain said journal part (155) in the center and but it can adapt to wider area of tolerance compared to the case with extender (154) being in the center.

If you refer to FIG. 1 and FIG. 7, the operation of the embodiment will be described. In FIG. 1, said linkage (120) is installed in the east-west direction. Control part which is not shown in the drawing will determine the angle of said solar panel (120) based on pre-input data and controls said drive unit to angle said solar panel (120) to determined degree.

Figure 7:
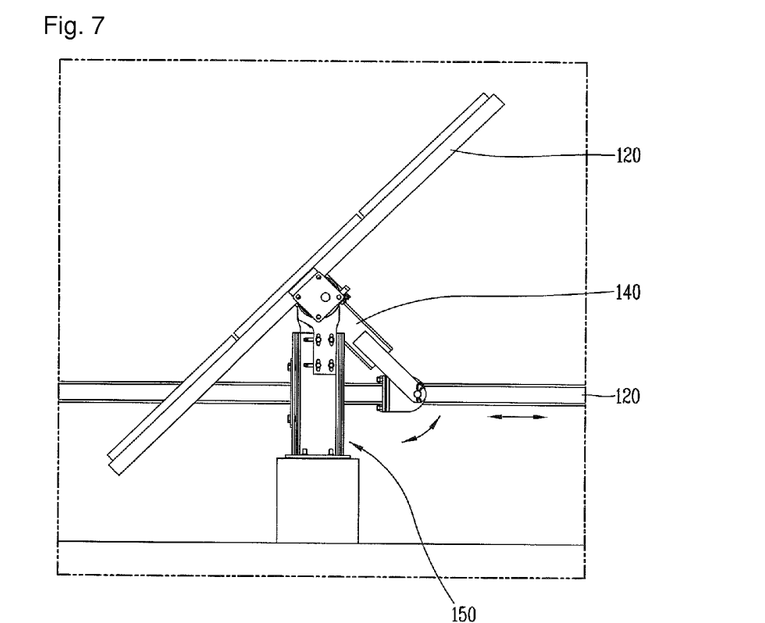
FIG. 7 illustrates the frontal view to show the operation status of the embodiment depicted in FIG. 1.

In order to accomplish this, by moving screw jack (240) front and back with operation of said drive unit motor (230), the linkage (120) will be moved back and forth as shown in FIG. 7 and the connected lever arm (140) will rotate on the axis of coupling point with said post. Accordingly, the torque tube which is anchored to lever arm (140) will be rotated and the angle of solar panel (120) compared to sun can be controlled.

Only single axis control, such as east-west angle control was described in this embodiment but it is not restricted to this embodiment only but it can also applied to two axis control system.

Figure 8:
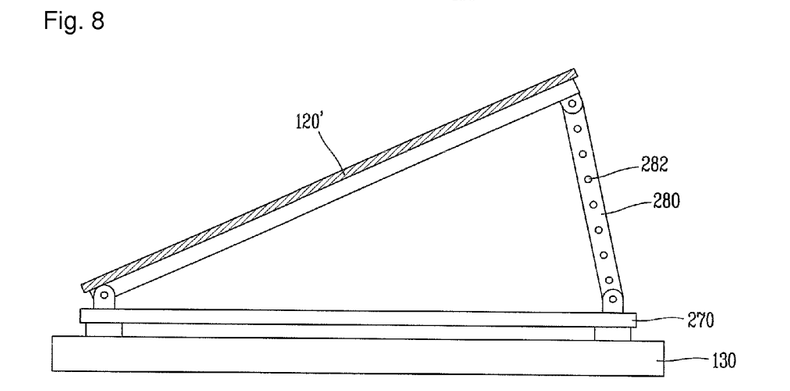
FIG. 8 illustrates a side view of another embodiment of the solar energy generation apparatus according to the present invention.

In other words, as shown in FIG. 8, a support plate (270) can installed on the surface of said torque tube (130) with hinge and anchoring of one solar panel (120) to said support plate (270) and the other end can be anchored to fixed arm (280). Here, said fixed arm (280) has multiple through holes (282) along the length and the support plate (270) can be anchored to one of these multiple through holes using anchor pin (not drawn). Accordingly, the south-north angle of solar panel (120) can be controlled by using certain holes in one of multiple through holes (282) (Controlling the angle of east-west direction is already described).

In this example of the drawing, controlling north-south angle of the solar panel (120) is controlled manually, and controlling the angle mechanically by using hydraulic cylinder or electric motor can be considered.

The invention claimed is:

1. A solar energy generation apparatus comprising torque tubes arranged in rows; solar panels installed along each torque tube; posts rotatably supporting at least one of the torque tubes, at least one of the posts anchored to ground to form an anchor, the anchor having a surface; a journal anchored to a top of the anchor, the journal having a surface facing the anchor surface; a first anchoring hole in the journal surface and having a first length greater than a first width, the first anchoring hole extending along the surface in a first direction; a second anchoring hole in the anchor surface and having a second length greater than a second width, the second anchoring hole extending along the anchor surface in a second direction not parallel to the first direction; a lever arm connected to at least one of the torque tubes; a linkage disposed under at least one of the torque tubes and connected to at least one of the lever arms; an actuator for actuating the linkage and causing rotation of the torque tube; and a bed supporting the actuator and disposed between some of the posts.

2. The solar energy generation apparatus of claim 1 wherein the bed includes a pair of beams anchored to a corresponding post and wherein the actuator is anchored to the pair of beams.

3. The solar energy generation apparatus of claim 2 wherein the linkage is disposed between the pair of beams and the actuator includes a rod connected to the linkage.

4. The solar energy generation apparatus of claim 2 wherein the bed is disposed between the posts to anchor the torque tube.

5. The solar energy generation apparatus of claim 4 wherein the rows of torque tubes comprise front rows, back rows, and middle rows, the actuator being disposed between the middle rows.

6. The solar energy generation apparatus of claim 1 wherein the journal comprises a first journal half anchored to the top of the anchor and a second journal half coupled to the first journal half, the solar energy generation apparatus further comprising a bearing anchored between the first and second journal halves and rotatably supporting at least one of the torque tubes.

7. The solar energy generation apparatus of claim 1 wherein the anchor has a ground surface facing the ground and a third anchoring hole having a third length and a third width, the third anchoring hole extending along the ground surface in a third direction parallel to the second direction such that the third length is greater than the third width.

8. The solar energy generation apparatus of claim 1 wherein the first direction is perpendicular to the second direction.

9. The solar energy generation apparatus of claim 1 wherein the first anchoring hole comprises a plurality of first anchoring holes each extending along the journal surface in the first direction such that each first length is greater than the respective first width.

10. The solar energy generation apparatus of claim 9 wherein the second anchoring hole comprises a plurality of second anchoring holes each extending along the anchor surface in the second direction such that each second length is greater than the respective second width.

11. The solar energy generation apparatus of claim 10 further comprising a greater number of first anchoring holes than second anchoring holes.

12. The solar energy generation apparatus of claim 11 further comprising twice as many first anchoring holes as second anchoring holes.

13. A solar energy generation apparatus comprising torque tubes arranged in rows; solar panels installed along each torque tube; posts rotatably supporting at least one of the torque tubes, at least one of the posts anchored to ground to form an anchor, the anchor having a surface; a journal comprising a first journal half anchored to the top of the anchor and a second journal half coupled to the first journal half, the journal having a surface facing the anchor surface; a first anchoring hole in the journal surface and having a first length greater than a first width, the first anchoring hole extending along the journal surface in a first direction; a second anchoring hole in the anchor surface and having a second length and a second width, the second anchoring hole extending along the anchor surface in a second direction not parallel to the first direction such that the second length is greater than the second width; a bearing anchored between the first and second journal halves and rotatably supporting at least one of the torque tubes; a lever arm connected to at least one of the torque tubes; a linkage disposed under at least one of the torque tubes and connected to at least one of the lever arms; an actuator for actuating the linkage and causing rotation of the torque tube; and a bed supporting the actuator and disposed between some of the posts.

14. The solar energy generation apparatus of claim 13 wherein the first journal half includes a partially circular cross-section bearing support to support the bearing and an anchoring part that is formed as one piece with the bearing support, the anchoring part forming said first anchoring hole.

15. The solar energy generation apparatus of claim 14 wherein the solar panel is rotatable and has an axis perpendicular to an axis of the torque tube.

16. The solar energy generation apparatus of claim 15 wherein a first side of the solar panel is hinged to the torque tube and a second side of the solar panel has a coupling to maintain certain angles.

17. The solar energy generation apparatus of claim 16 wherein the coupling is disposed between the second side of the solar panel and the torque tube, further comprising an anchoring arm with multiple holes along its length and an anchoring pin that inserts through at least one of the multiple holes to couple the solar panel to the torque tube.

18. A solar energy generation apparatus comprising:
torque tubes arranged in rows;
solar panels installed along each torque tube;
posts rotatably supporting at least one of the torque tubes, at least one of the posts anchored to ground to form an anchor, the anchor having a surface;
a journal anchored to a top of the anchor, the journal having a surface facing the anchor surface;
a first anchoring hole in the journal surface and having a first length greater than a first width, the first anchoring extending along the journal surface in a first direction;
a second anchoring hole in the anchor surface and having a second length greater than a second width, the second anchoring hole extending along the anchor surface in a second direction not parallel to the first direction.

19. The solar energy generation apparatus of claim 18 wherein the journal comprises a first journal half anchored to the top of the anchor and a second journal half coupled to the first journal half, the solar energy generation apparatus further comprising a bearing anchored between the first and second journal halves and rotatably supporting at least one of the torque tubes.

20. The solar energy generation apparatus of claim 19 wherein the first journal half includes a partially circular cross-section bearing support to support the bearing and an anchoring part that is formed as one piece with the bearing support, the anchoring part forming said first anchoring hole.

* * * * *